United States Patent [19]

Morris

[11] Patent Number: 5,304,867
[45] Date of Patent: Apr. 19, 1994

[54] CMOS INPUT BUFFER WITH HIGH SPEED AND LOW POWER

[75] Inventor: Bernard L. Morris, Allentown, Pa.

[73] Assignee: AT&T Bell Laboratories, Murray Hill, N.J.

[21] Appl. No.: 806,890

[22] Filed: Dec. 12, 1991

[51] Int. Cl.$^5$ .............................................. H03K 17/16
[52] U.S. Cl. .................................. 307/443; 307/451; 307/548
[58] Field of Search ............... 307/448, 443, 451, 548, 307/550

[56] References Cited

U.S. PATENT DOCUMENTS

| | | | |
|---|---|---|---|
| 4,210,829 | 7/1980 | Wong et al. | 307/550 |
| 4,437,024 | 3/1984 | Wacyk | 307/475 |
| 4,471,242 | 9/1984 | Noufer et al. | 307/475 |
| 4,672,243 | 6/1987 | Krisch | 307/475 |
| 4,791,323 | 12/1988 | Austin | 307/451 |
| 4,806,801 | 2/1989 | Argade | 307/475 |
| 4,825,106 | 4/1989 | Tipon et al. | 307/451 |
| 5,036,226 | 7/1991 | Tonnu et al. | 307/455 |
| 5,144,167 | 9/1992 | McClintock | 307/450 |
| 5,151,622 | 9/1992 | Thrower | 307/451 |

FOREIGN PATENT DOCUMENTS 125733  5/1984  European Pat. Off. .

Primary Examiner—Edward P. Westin
Assistant Examiner—Andrew Sanders
Attorney, Agent, or Firm—James H. Fox

[57] ABSTRACT

Prior-art high speed TTL-to-CMOS input buffers consume a large amount of power supply current through the input transistors when the input voltage is held at a mid-range level between $V_{DD}$ and $V_{SS}$ (e.g., 2.0 volts). The inventive input buffer includes a resistance in series with the p-channel pull-up transistor on the input inverter, in order to limit this current. In addition, to retain high operating speed, a p-channel shunt transistor is placed in parallel with the resistance, and controlled by the buffer output signal. This shunt transistor effectively bypasses the resistance from the circuit when the buffer output goes low, thereby providing high operating speed.

11 Claims, 2 Drawing Sheets

CMOS INPUT BUFFER WITH HIGH SPEED AND LOW POWER

BACKGROUND OF THE INVENTION

1. Field of the Invention

The present invention relates to an integrated circuit having a complementary (e.g., CMOS) input buffer.

2. Description of the Prior Art

Integrated circuits (ICs) use one or more input buffers to interface with external circuitry that supplies digital or analog signals to the IC. In the case of CMOS (from Complementary Metal Oxide Semiconductor) integrated circuits, the input buffer typically takes the form shown in FIG. 1. An input voltage $V_{in}$ is applied to the gates of p-channel pull-up transistor 11 and n-channel pull-down transistor 12, which form an input inverter complementary pair. The drains of input transistors 11 and 12 are coupled to common node 13, which drives the gates of the output inverter complementary pair, transistors 14 and 15. This output inverter is usually included to provide additional capability to chive various other circuitry on the IC from the buffer output node 16. One criteria of buffer operation is propagation delay, which is the difference in time that the input crosses the switching threshold of the input inverter pair (typically about 1.5 volts) to the time the output (node 16) crosses the voltage of $\frac{1}{2} V_{DD}$ (typically about 2.5 volts). Another criteria is power consumption, which depends in large part upon the current $I_1$ that flows through the input inverter.

In the case of buffers designed to receive transistor-transistor logic (TTL) voltage levels, the current $I_1$ may become undesirably large. This is because the TTL logic levels are, at worst case, 0.8 volts (low) or 2.0 volts (high). These voltages are usually above the conduction thresholds of CMOS transistors 11 and 12. That is, the p-channel input transistor (I 1) and n-channel input transistor (12) may both be conducting at $V_{in}=0.8$ volts, and typically even more conducting at $V_{in}=2.0$ volts. Therefore, since DC voltages may be present at these levels when TTL input signals are supplied, a relatively large current $I_1$ may flow, causing undesirably high power consumption by the input buffer. One technique of limiting this current flow is to make the input transistors smaller, which increases their "on" resistance. However, that has the undesirable effect of limiting the speed of the input transistors. Hence, a solution to the problem has been sought by other means.

One technique that has been successfully adopted in practice is shown in U.S. Pat. No. 672,243 co-assigned herewith. That technique makes use of a transition detector to control a voltage boosting means connected to the input of the first inverter, and may be considered a "feed-forward" technique. However, that technique requires a relatively large number of additional transistors. In another approach, a voltage-dropping transistor is inserted between the positive power supply ($V_{DD}$) and the p-channel input transistor; see, for example, U.S. Pat. No. 4,471,242. The reduced operating voltage prevents the p-channel input transistor from turning on when the lowest level of a logic "1" is present. However, that approach typically results in a significant reduction of operating speed.

SUMMARY OF THE INVENTION

I have invented an integrated circuit input buffer having a feedback signal that limits the current flowing through the input inverter over a portion of the input signal range. In a preferred embodiment, a resistance means is located in series with a power supply lead that supplies DC current to the input pull-up or pull-down transistor. A switching means responsive to the feedback signal is connected so as to effectively bypass the resistance means when a buffer output signal passes a given threshold.

DETAILED DESCRIPTION

Figure 2:
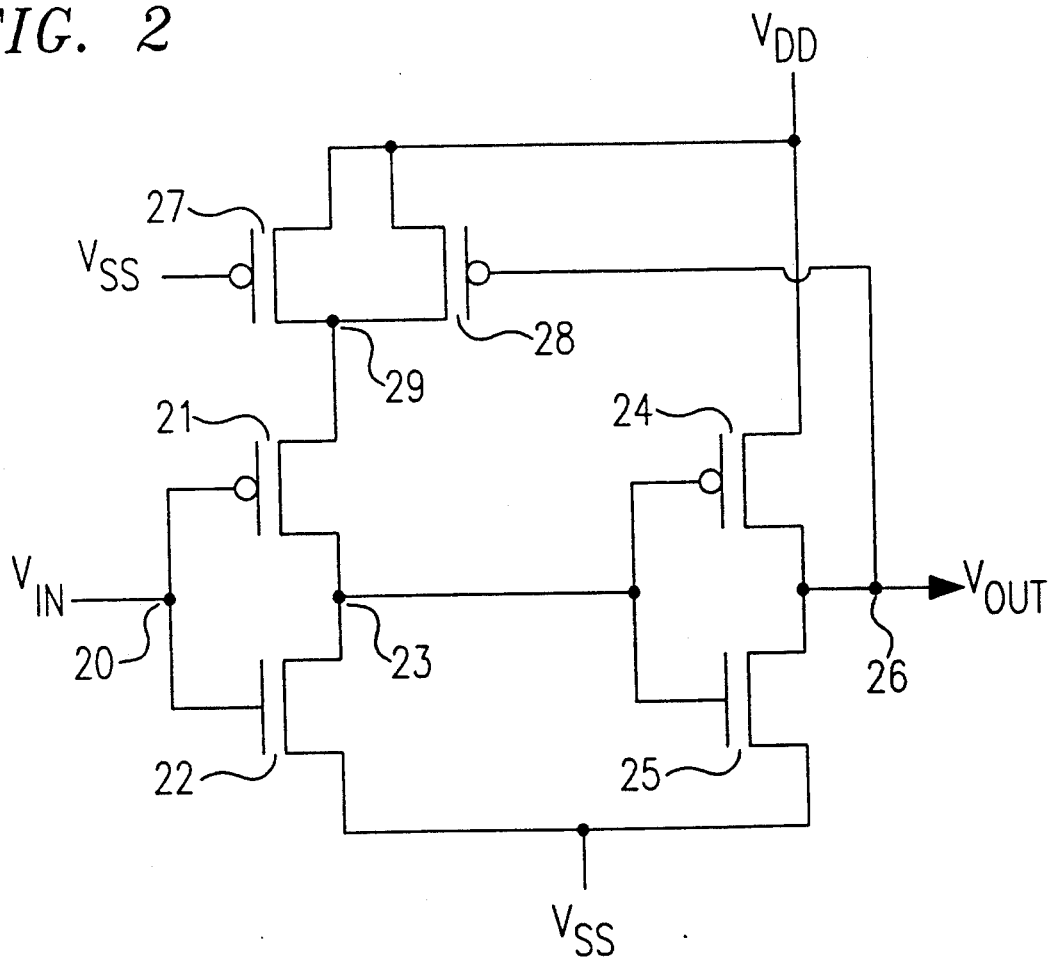
FIG. 2 shows one embodiment of the present invention.

The following detailed description relates to an integrated circuit having at least one input buffer that includes a complementary-pair input inverter. Referring to FIG. 2, an illustrative embodiment of the invention as implemented in CMOS technology is shown. The input inverter comprises complementary transistor pair 21 and 22, whereas the output inverter comprises complementary transistor paid 24 and 25. In addition, a resistance means is placed in series with transistor 21; that is, between the source of transistor 21 and the positive power supply ($V_{DD}$). In a typical case, the resistance means is implemented using a p-channel transistor (27) having its gate connected to $V_{SS}$, as shown. A p-channel "shunt" transistor (28) is placed in parallel with the resistance means, with the gate of transistor (28) being connected to the output node (26). In operation, the channel current through the input inverter transistors 21 and 22 is limited by the resistance means, as long as shunt transistor 28 is non-conductive. This allows for significantly reducing the DC power flow through the input inverter. When shunt transistor 28 conducts, the resistance means is effectively bypassed, which allows for high-speed operation to be obtained.

The operation may be understood by considering the following sequence:

(1) When $V_{in}$ (node 20) is low (0 volts), the output node of the input inverter (23) is high, and the output node of the output inverter (26) is low. Thus, transistor 28 is "on" (conductive), and node 29 is held at a solid $V_{DD}$. As $V_{in}$ increases past the switching threshold of the input inverter, node 23 goes low and node 26 goes high, which turns transistor 28 "off" (non-conductive). In a typical TTL input buffer, the switching threshold of the input inverter is set at about 1.5 volts. When transistor 28 is off, the only DC current that can flow through the input inverter is through the resistance means, being transistor 27. In a typical case, this is about an order of magnitude less current than would be normally flowing through the input inverter when $V_{in}=2$ volts. Hence, in this exemplary case, the resistance means is included in the current path of the input inverter for the range of $V_{in}$ from 1.5 to 5 volts.

(2) When $V_{in}$ is decreasing from a high value, shunt transistor 28 is initially off. As $V_{in}$ crosses the switching threshold of the input inverter (e.g., 1.5 volts), node 23 goes high. This forces node 26 to go low, and thus turns on transistor 28, which brings node 29 to a solid $V_{DD}$. Hence, the resistance means is effectively bypassed, removing it from the current path of the input inverter for the range of $V_{in}$ from 1.5 to 0 volts. In the time between $V_{in}$ crossing the switching threshold and transistor 28 turning on, the only current available to keep node 29 high is provided by transistor 27. This consideration places an upper limit on the resistance of transistor 27, which in turn places a lower limit on power reduction.

EXAMPLE

Figure 1:
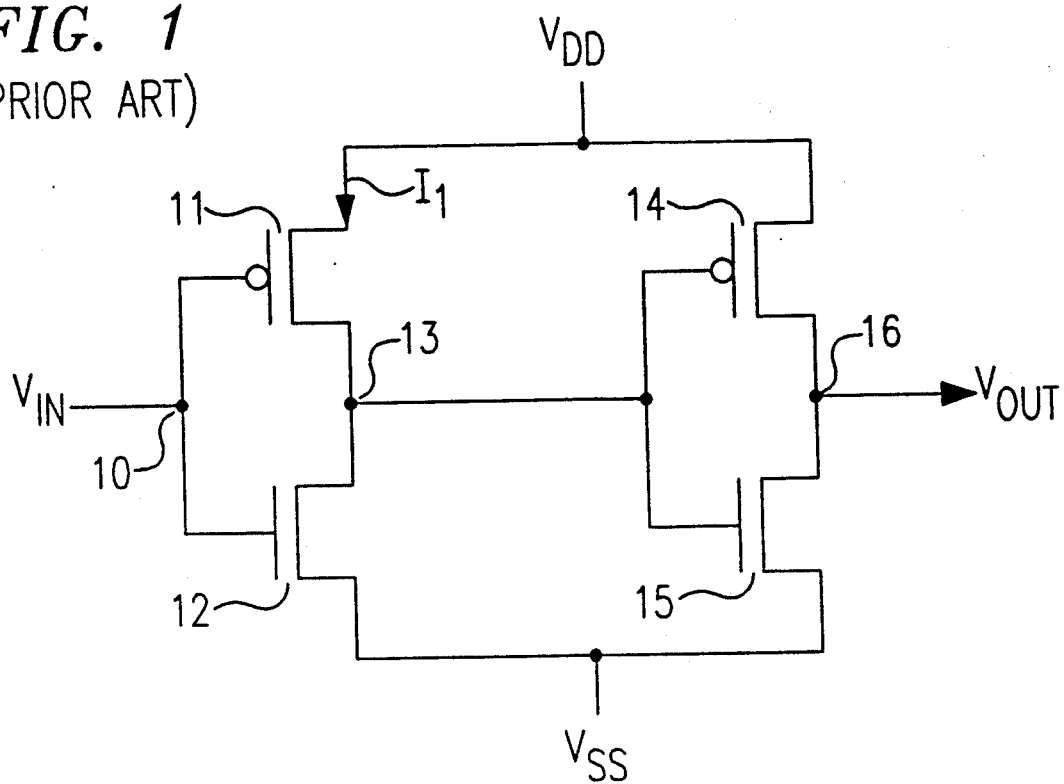
FIG. 1 shows a typical prior-art TTL to CMOS input buffer.

An input buffer was implemented in 0.9 micron CMOS technology, with input inverter transistors 21 and 22 having channel width/length (W/L) of 7.75/1.5 and 22.1/1.4 micrometers, respectively, to provide a switching threshold of 1.5 volts. The size (WAL) of output inverter transistor 25 was twice that of transistor 24, to provide rapid turn-off of shunt transistor 28. The shunt transistor 28 had a WAL of 80, and the resistance means transistor 27 had a WAL of 3/100. (This gave transistor 27 a resistance of about 1 megohm.) This design provided a decrease in the worst-case ($V_{in}=2$ volts) power consumption of a factor of 15. However, the worst-case speed was only 9 percent slower at a load of 3 picofarads (at node 26) as compared to the nominal switching speed (about 4 nanoseconds) of a conventional buffer as shown in FIG. 1 having the same size inverter transistors. Furthermore, has the switching threshold voltage of the input inverter was not significantly affected by transistors 27 and 28, being the same as that of the conventional buffer (FIG. 1). The exemplary transistor sizes are not necessarily optimum for all applications, and a wide variety of other transistor ratios are possible, depending on the amount of power reduction desired and the amount of speed reduction that can be tolerated. In general, when a transistor is used as the resistance means, I recommend that it have a width-to-length ratio (W/L) in the range of from about 3/200 to 3/20 for TTL input levels.

Figure 3:
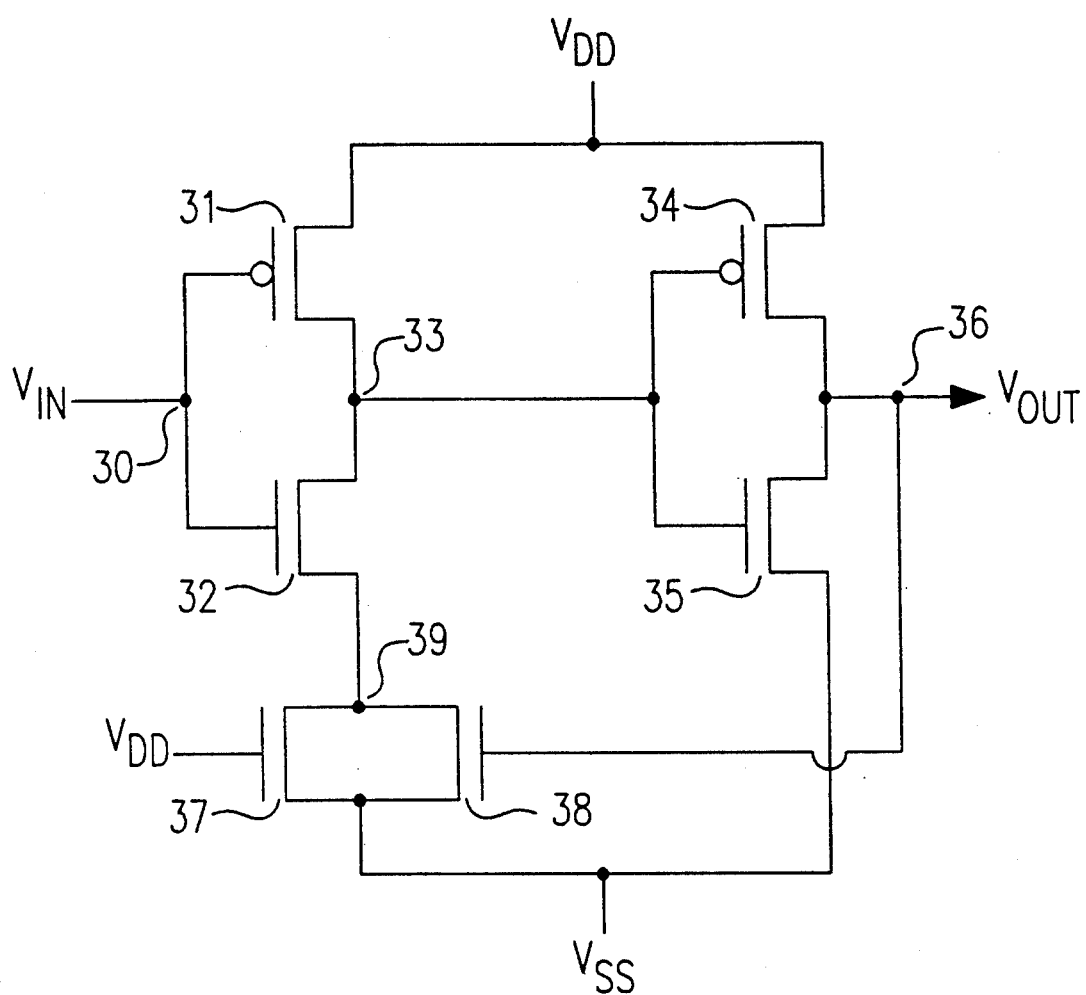
FIG. 3 shows an alternate embodiment of the present invention.

An alterative embodiment of the invention is illustrated in FIG. 3. In that case, the resistance means (transistor 37) and the shunt transistor (38) are located between the source of the n-channel input inverter transistor (32) and $V_{SS}$. Note that the resistance transistor and shunt transistor are n-channel in this embodiment. Furthermore, the resistance is included in series with the input inverter when $V_{out}$ (node 36) goes low, rather than high as in the embodiment of FIG. 2. Therefore, in the case of a TTL input buffer, since the desired switching threshold is about 1.5 volts, the possibility of a large power reduction without compromising performance is not as great in the embodiment of FIG. 3 as compared to FIG. 2. However, it may be more useful in other applications. In addition, it is possible to combine the embodiments of FIGS. 2 and 3, wherein resistance means and shunt transistors are included between the input inverter for both power supply voltage connections. That may be used to provide still further power reduction, as in very low power (e.g., battery powered) applications.

While the above embodiments have been described as T-FL input buffers, still other applications of the inventive technique are possible, and included herein. For example, an input buffer operating from a 5 volt power supply may be designed to receive 3.3 volt logic levels. In that case, the present invention provides for reduced power consumption when the input signal is at the high (e.g., 3.3 volt) logic level. The use of the present technique with analog input signals is also possible, and also included herein. Furthermore, the above embodiments have shown two inverter stages in the buffer, which is adequate in most cases. However, if additional drive capability is desired, still more inverter stages may be added following the second inverter shown. In that case, it is still desirable to connect the gate of the shunt transistor to the output of the second inverter, as shown, which is considered to be the buffer output node as used herein. Finally, while the above implementation has been shown in CMOS technology, the inventive technique may be applied to any technology that implements complementary transistors (i.e., those having different conductivity types), including bipolar technology.

As shown in the above embodiments, the resistor means is implemented as an insulated gate enhancement-mode field effect transistor. Depletion-mode devices may alteratively be used, in which case the gate is typically connected to the opposite power supply terminal shown above. The use of a transistor as the resistance means is relatively easy to implement, and readily provides the desired resistance in a relatively small area. In addition, a transistor may be formed by the same processes used to form the other transistors in the input buffer. Therefore, the resistance means will tend to track changes in fabrication processing conditions and temperature that affect the other buffer transistors, thereby at least partially compensating for such changes. However, still other resistor types are possible, including the use of doped regions in a silicon substrate, or deposited resistors, including polysilicon types.

I claim:

1. An integrated circuit having an input buffer comprising an input inverter having a p-channel field effect transistor serially connected with an n-channel field effect transistor that are coupled to receive an input signal, and an output inverter coupled to a buffer output node, Characterized in that said buffer further comprises a current-limiting transistor biased to conductor and directly connected in series between a controlled electrode of a first one of the complementary transistors of said input inverter and a power supply conductor;

and still further comprises a shunt transistor having controlled electrodes connected in parallel with said current-limiting transistor and having a control electrode coupled to said buffer output node.

2. The integrated circuit of claim 1 wherein said current-limiting transistor is a field effect transistor having its gate connected to a power supply voltage conductor.

3. The integrated circuit of claim 2 wherein said field effect transistor is a p-channel transistor.

4. The integrated circuit of claim 3 wherein said p-channel transistor is an enhancement mode device, and has its gate connected to a negative power supply voltage conductor.

5. The integrated circuit of claim 4 wherein said output inverter comprises a p-channel field effect transistor serially connected with an n-channel field effect transistor.

6. The integrated circuit of claim 2 wherein said field effect transistor is an n-channel transistor.

7. The integrated circuit of claim 6 wherein said n-channel transistor is an enhancement mode device, and has its gate connected to a positive power supply voltage conductor.

8. The integrated circuit of claim 7 wherein said output inverter comprises a p-channel field effect transistor serially connected with an n-channel field effect transistor.

9. An integrated circuit having an input buffer comprising:
- a first inverter comprising an n-channel field effect transistor having its source connected to a negative power supply conductor, its gate connected to an input node, and its drain connected to a first inverter output node; and a p-channel field effect transistor having its gate connected to said input node, its drain connected to said first inverter output node, and its source connected to a given node;
- a second inverter comprising an n-channel and a p-channel field effect transistor having their gates connected to said first inverter output node, their sources connected to negative and positive power supply voltage conductors, respectively, and their drains connected to a buffer output node;

Characterized in that said buffer further comprises a resistance p-channel transistor having its drain connected to said given node, its source connected to a positive power supply voltage conductor, and its gate connected to a negative power supply voltage conductor;

and still further comprises a shunt p-channel transistor having its drain connected to said given node, its source connected to said positive power supply voltage conductor, and its gate connected to said buffer output node.

10. The integrated circuit of claim 2 wherein said current-limiting field effect transistor has a width-to-length ratio (W/L) in the range of from 3/200 to 3/20.

11. The integrated circuit of claim 9 wherein said resistance p-channel field effect transistor has a width-to-length ratio (W/L) in the range of from 3/200 to 3/20.

* * * * *